(12) United States Patent
Mori et al.

(10) Patent No.: US 10,698,834 B2
(45) Date of Patent: Jun. 30, 2020

(54) MEMORY SYSTEM

(71) Applicant: TOSHIBA MEMORY CORPORATION, Minato-ku, Tokyo (JP)

(72) Inventors: Takayuki Mori, Hachioji Tokyo (JP); Satoshi Kaburaki, Meguro Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 18 days.

(21) Appl. No.: 16/212,227

(22) Filed: Dec. 6, 2018

(65) Prior Publication Data
US 2019/0286571 A1    Sep. 19, 2019

(30) Foreign Application Priority Data

Mar. 13, 2018 (JP) ................. 2018-045556

(51) Int. Cl.
*G06F 11/00* (2006.01)
*G06F 12/1009* (2016.01)
*G06F 11/10* (2006.01)
*G11C 29/52* (2006.01)

(52) U.S. Cl.
CPC ...... *G06F 12/1009* (2013.01); *G06F 11/1068* (2013.01); *G11C 29/52* (2013.01); *G06F 2212/1032* (2013.01); *G06F 2212/1044* (2013.01); *G06F 2212/657* (2013.01)

(58) Field of Classification Search
None
See application file for complete search history.

(56) References Cited

U.S. PATENT DOCUMENTS

| | | | |
|---|---|---|---|
| 7,596,654 B1* | 9/2009 | Wong | G06F 12/0813 703/21 |
| 8,135,900 B2 | 3/2012 | Kunimatsu et al. | |
| 8,448,034 B2* | 5/2013 | Asano | G06F 11/1068 714/747 |

(Continued)

OTHER PUBLICATIONS

K. Bang, S. Park, M. Jun and E. Chung, "A memory hierarchy-aware metadata management technique for Solid State Disks," 2011 IEEE 54th International Midwest Symposium on Circuits and Systems (MWSCAS), Seoul, 2011, pp. 1-4. (Year: 2011).*

*Primary Examiner* — Daniel F. McMahon
(74) *Attorney, Agent, or Firm* — Foley & Lardner LLP

(57) ABSTRACT

A memory system includes a memory controller and a memory that is nonvolatile. The memory controller divides first information, which correlates a logical address with a physical address of the memory, into multiple pieces of second information, attaches metadata to each of the multiple pieces of second information and stores each piece of second information with the attached metadata, into the memory, when using third information, which is one of the multiple pieces of second information, reads, as multiple pieces of fourth information, pieces of second information including the third information, from among the multiple pieces of second information stored in the memory, selects fifth information, which is different from the third information, from among the read multiple pieces of fourth information based on the metadata attached to each of the multiple pieces of fourth information, and caches the selected fifth information into another memory.

20 Claims, 12 Drawing Sheets

(56) References Cited

U.S. PATENT DOCUMENTS

| | | | |
|---|---|---|---|
| 8,868,882 B2* | 10/2014 | Ali | G06F 3/0653 |
| | | | 711/202 |
| 2010/0011156 A1* | 1/2010 | Yim | G06F 12/0246 |
| | | | 711/103 |
| 2013/0111116 A1* | 5/2013 | Inada | G06F 12/02 |
| | | | 711/103 |
| 2013/0275656 A1* | 10/2013 | Talagala | G06F 3/0679 |
| | | | 711/103 |
| 2015/0074334 A1 | 3/2015 | Kondo et al. | |
| 2016/0062916 A1* | 3/2016 | Das | G06F 12/128 |
| | | | 711/133 |
| 2017/0068621 A1 | 3/2017 | Watanabe et al. | |
| 2018/0041614 A1* | 2/2018 | Ben-Chen | H04L 69/321 |

* cited by examiner

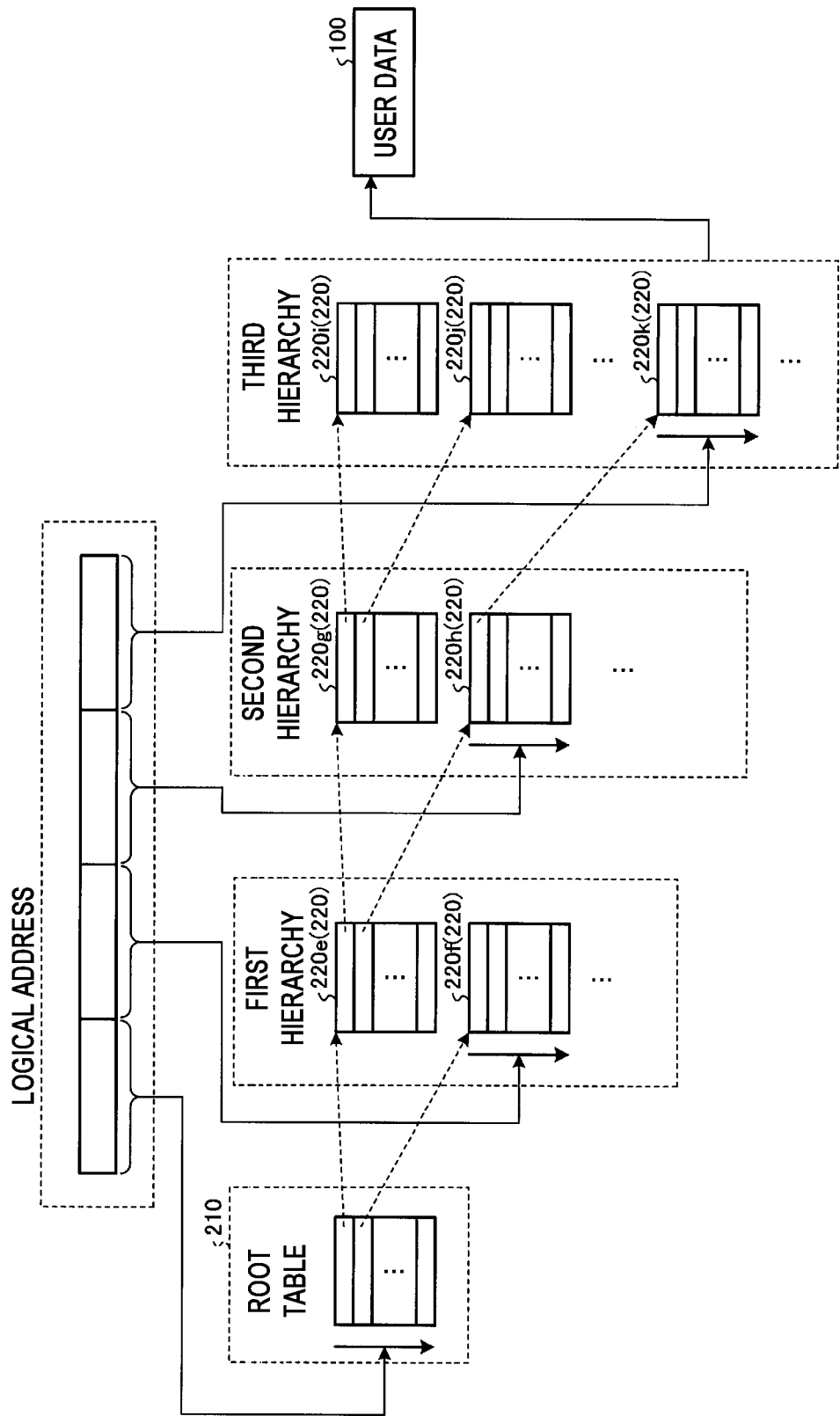

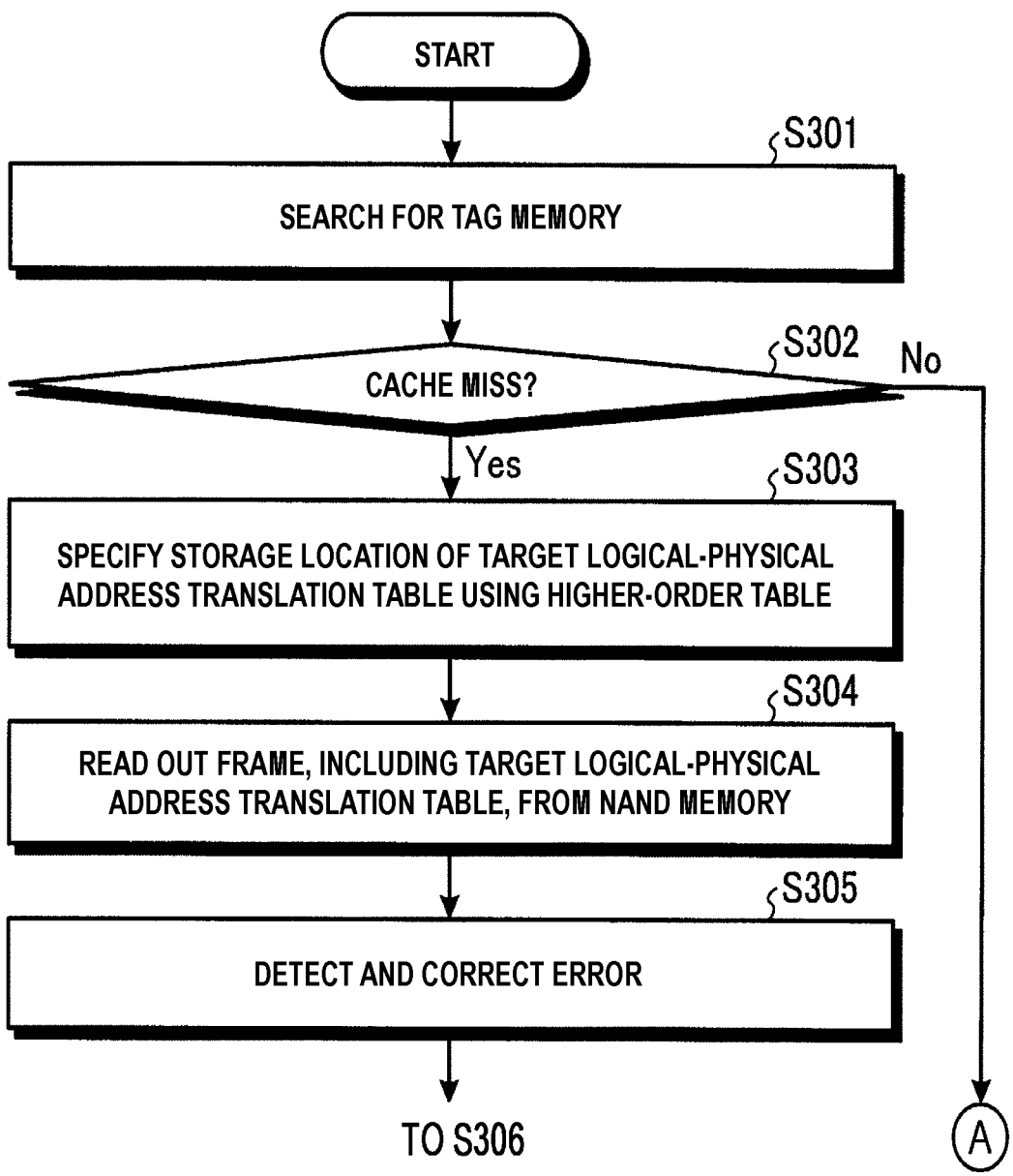

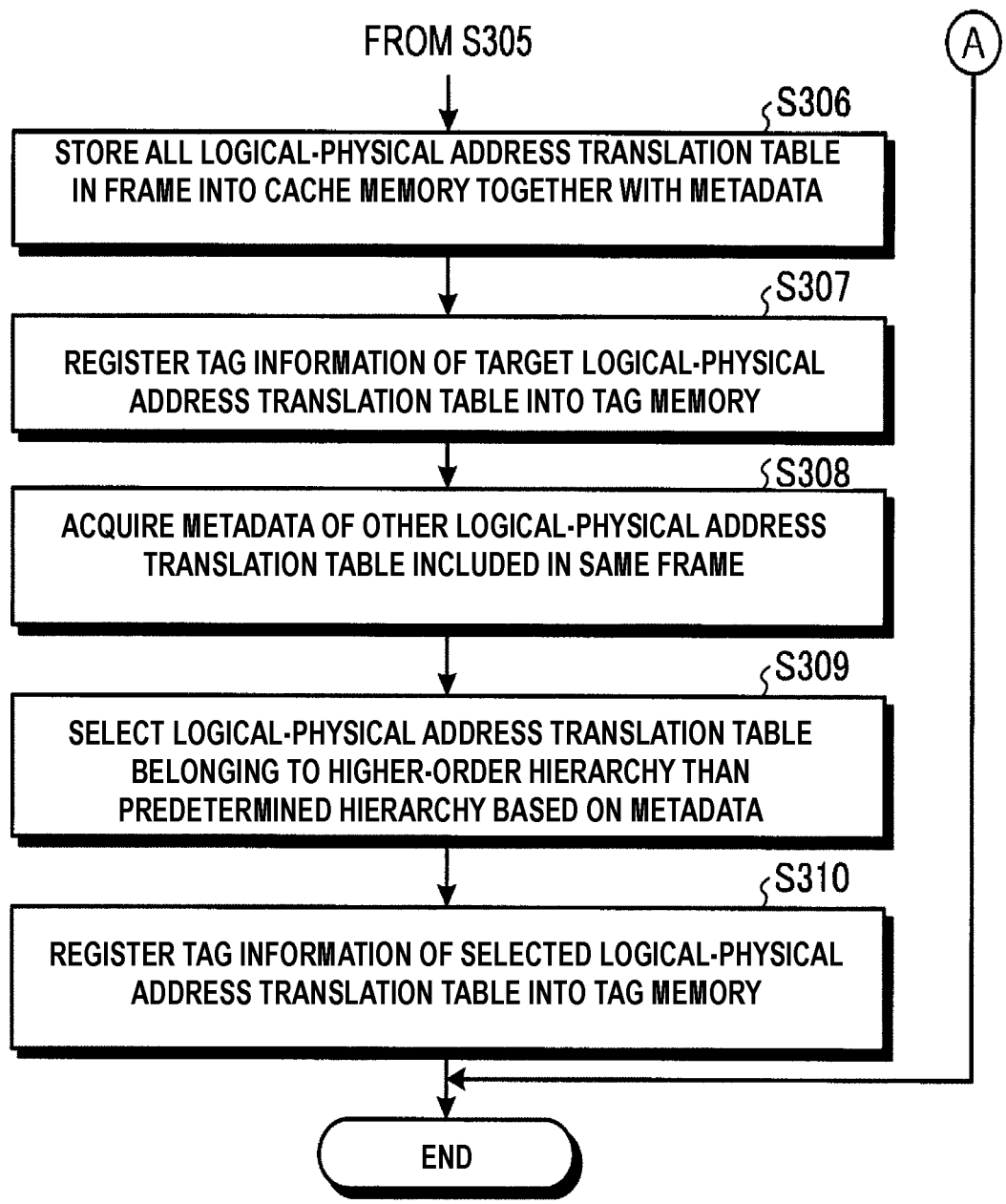

MEMORY SYSTEM

CROSS-REFERENCE TO RELATED APPLICATION

This application claims the benefit of and priority to Japanese Patent Application No. 2018-045556, filed Mar. 13, 2018, the entire contents of which are incorporated herein by reference.

FIELD

Embodiments described herein relate generally to a memory system.

BACKGROUND

In the related art, a memory system may include an NAND type flash memory (hereinafter, referred to as a "NAND memory"). The memory system may include a memory controller, which controls data transmission between a host and a NAND memory. The memory controller may manage the correspondence between a logical address and a physical address as logical-physical address translation information. The logical address is location information indicating a location in a logical address space that the memory system provides to the host. The physical address is location information indicating a physical location in a NAND memory.

The memory controller may cache the logical-physical address translation information into a memory such as a random access memory (RAM), which allows a high-speed operation, and use the cached logical-physical address translation information when the cache is hit.

DESCRIPTION OF THE DRAWINGS

FIG. 7 is a diagram for explaining a data structure of logical-physical address translation information according to a second embodiment.

FIGS. 9A and 9B are flowcharts illustrating a cache operation of the memory system according to the second embodiment.

DETAILED DESCRIPTION

Figure 1:
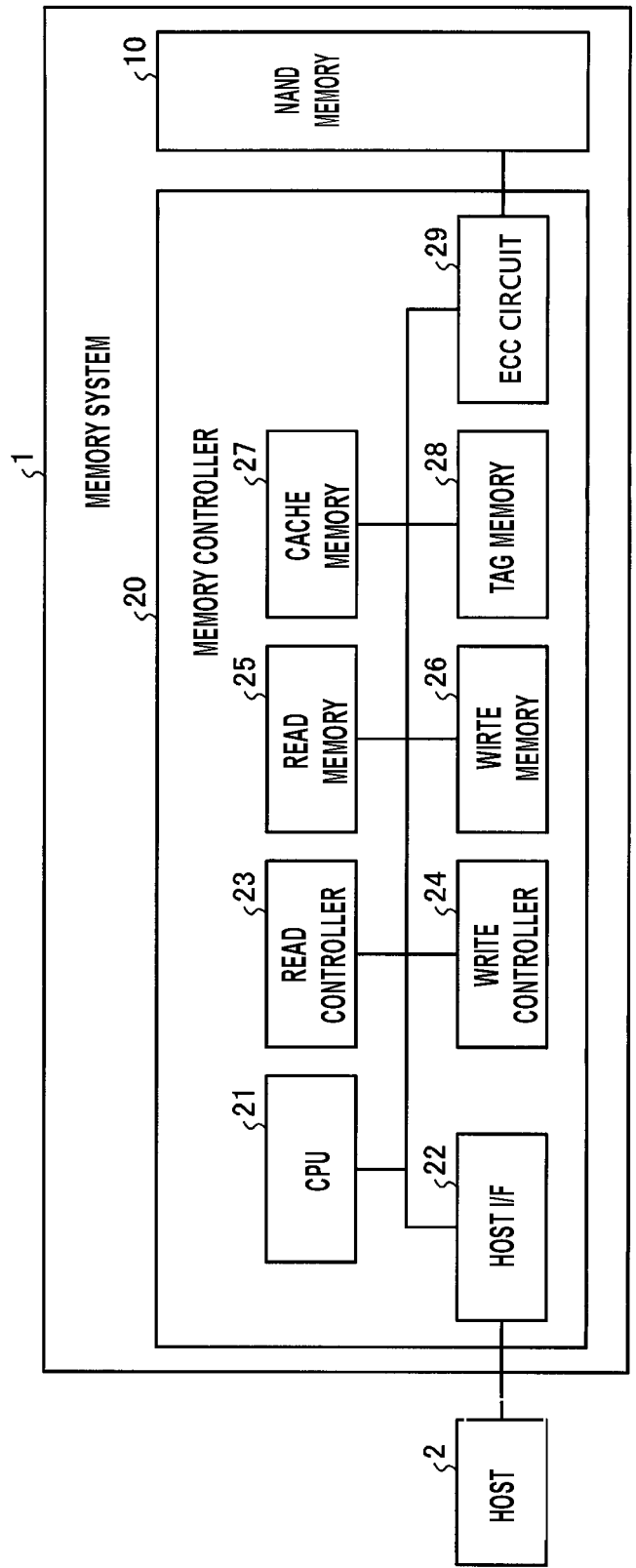
FIG. 1 is a diagram illustrating a configuration of a memory system according to a first embodiment.

Embodiments provide a memory system with high performance.

According to some embodiments, a memory system is connectable to a host. The memory system may include a memory controller and a first memory that is nonvolatile. The memory controller may divide first logical-physical address translation information, which correlates a logical address with a physical address of the first memory, into a plurality of pieces of second logical-physical address translation information. The memory controller may attach metadata to each of the plurality of pieces of second logical-physical address translation information and store each of the plurality of pieces of second logical-physical address translation information with the attached metadata, into the first memory. When using third logical-physical address translation information, which is one of the plurality of pieces of second logical-physical address translation information, the memory controller may read, as a plurality of pieces of fourth logical-physical address translation information, pieces of second logical-physical address translation information including the third logical-physical address translation information, from among the plurality of pieces of second logical-physical address translation information stored in the first memory. The memory controller may select fifth logical-physical address translation information, which is different from the third logical-physical address translation information, from among the read plurality of pieces of fourth logical-physical address translation information based on the metadata attached to each of the plurality of pieces of fourth logical-physical address translation information. The memory controller may cache the selected fifth logical-physical address translation information into a second memory.

According to some embodiments, a method of performing a cache operation in a memory system connectable to a host and including a memory controller and a first memory that is nonvolatile, includes dividing, by the memory controller, first logical-physical address translation information, which correlates a logical address with a physical address, into a plurality of pieces of second logical-physical address translation information. The method may include attaching, by the memory controller, metadata to each of the plurality of pieces of second logical-physical address translation information and storing each of the plurality of pieces of second logical-physical address translation information with the attached metadata, in the first memory. The method may include when using third logical-physical address translation information, which is one of the plurality of pieces of second logical-physical address translation information, reading, as a plurality of pieces of fourth logical-physical address translation information, pieces of second logical-physical address translation information including the third logical-physical address translation information, from among the plurality of pieces of second logical-physical address translation information stored in the first memory. The method may include caching the third logical-physical address translation information in a second memory. The method may include registering a logical address range included by the metadata, which is added to the third logical-physical address translation information, as tag information. The metadata attached to each of the plurality of pieces of second logical-physical address translation information may include a logical address range covered by the corresponding second logical-physical address translation information.

Hereinafter, a memory system according to embodiments will be described in detail with reference to the accompanying drawings. In addition, it should be noted that the present disclosure is not limited by these embodiments.

First Embodiment

FIG. 1 is a diagram illustrating a configuration of a memory system according to a first embodiment. The memory system 1 may be connected to a host 2. Any standard such as PCI Express® may be adopted for the connection. The host 2, for example, a personal computer, a portable information terminal, a server, or the like.

The memory system 1 may receive an access request (e.g., a read request and a write request) from the host 2. Each access request may involve a logical address indicating an access target. The logical address may be location information indicating a location in a logical address space provided to the host 2 by the memory system 1. The memory system 1 may receive data to be written, along with a write request. Hereinafter, data to be written, which is received from the host 2, is referred to as "user data".

The memory system 1 may include a NAND type flash memory (NAND memory) 10, and a memory controller 20 which executes data transmission between the host 2 and the NAND memory 10.

The NAND memory 10 is an example of a nonvolatile first memory. As the first memory, any kind of nonvolatile memory may be adopted.

The NAND memory 10 may include a memory cell array including a plurality of blocks. Data stored in each block may be erased all at once. Each block may include a plurality of pages. Writing of data to the memory cell array and reading of data from the memory cell array may be executed on a page basis.

Figure 2:
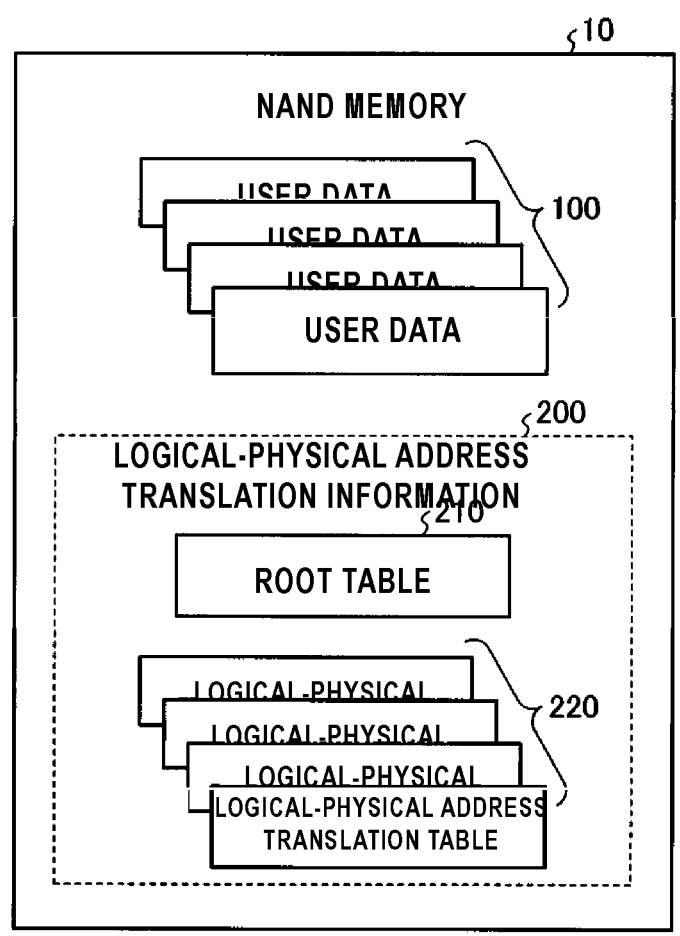
FIG. 2 is a diagram illustrating data stored in an NAND memory according to the first embodiment.

FIG. 2 is a diagram illustrating data stored in the NAND memory 10 according to the first embodiment. As illustrated in this figure, user data 100 and logical-physical address translation information 200 may be stored in the NAND memory 10.

The user data 100 may be data received from the host 2, as described above. The memory controller 20 may perform a predetermined processing on the user data 100 and then store the user data 100 into the NAND memory 10. The predetermined processing includes encoding for error correction, for example.

The logical-physical address translation information 200 may be information indicating a correspondence relationship between a logical address and a physical address. The physical address may be location information indicating a physical location in the NAND memory 10.

For example, when the memory system 1 newly receives user data 100 from the host 2, the user data 100 (new user data 100) may be stored in a block having an available area. When the new user data 100 is stored in the block, the logical-physical address translation information 200 may be updated. The logical address of the new user data 100 may be correlated with a physical address indicating the location at which the new user data 100 is stored by updating the logical-physical address translation information 200.

When the memory system 1 receives a read request from the host 2, a physical address correlated with a logical address involved in the read request may be specified based on the logical-physical address translation information 200. That is, the logical address may be translated into the physical address. Then, the user data 100 is read from the location indicated by the translated physical address and is transmitted to the host 2.

In the first embodiment, for example, the logical-physical address translation information 200 is composed of one root table 210 and a plurality of logical-physical address translation tables 220.

Figure 3:
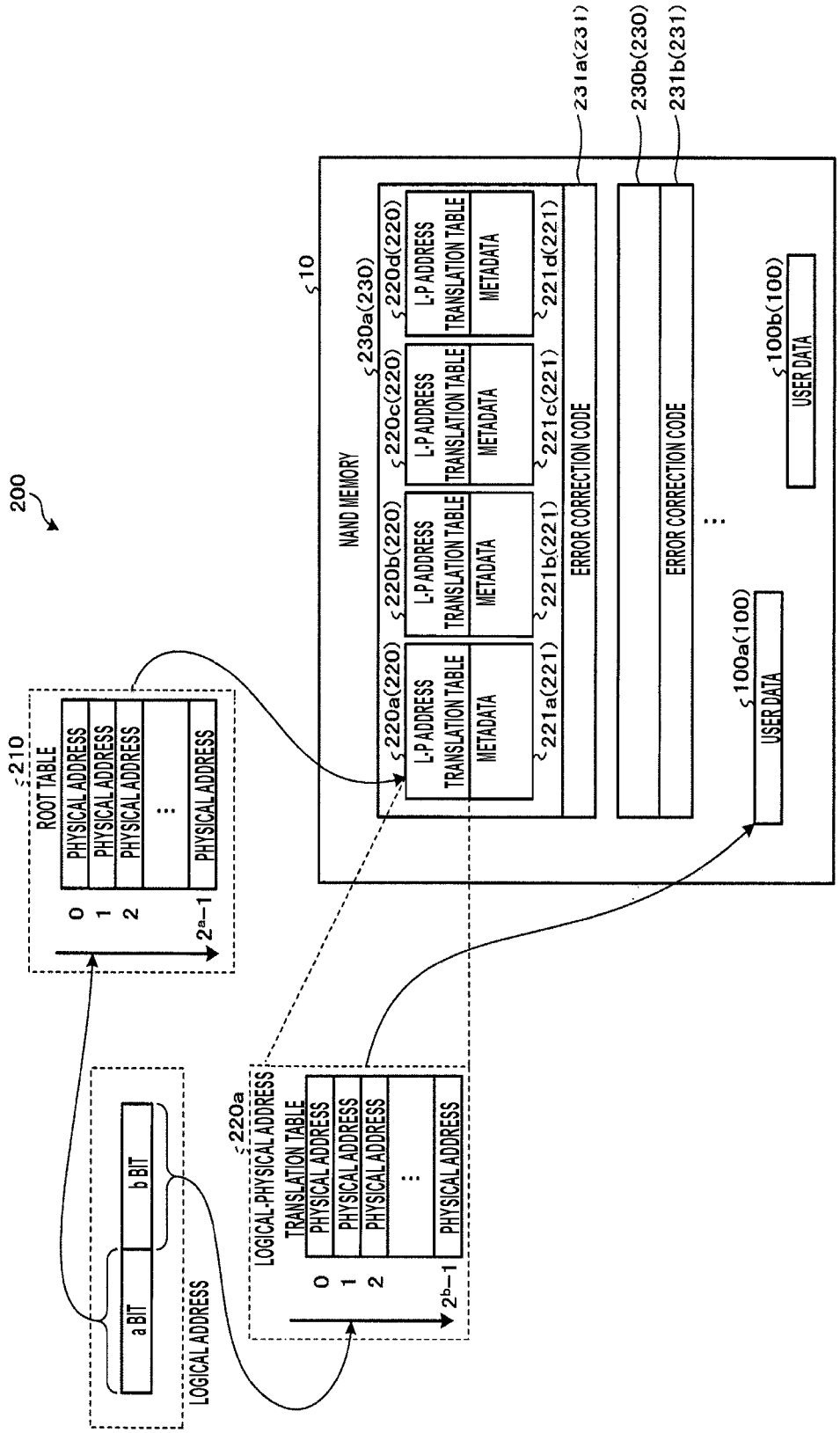
FIG. 3 is a diagram for explaining a data structure of logical-physical address translation information according to the first embodiment.

FIG. 3 is a diagram for explaining a data structure of the logical-physical address translation information 200 according to the first embodiment. In this figure, four pieces of logical-physical address translation information 220a to 220d are illustrated as the plurality of logical-physical address translation tables 220. The four pieces of logical-physical address translation information 220a to 220d may have the same data structure. In this figure, as a representative figure, a detailed data structure is illustrated only for the logical-physical address translation information 220a. Other logical-physical address information (e.g., 220b-220d) may also have similar data structure.

In the first embodiment, a logical address space provided to the host 2 by the memory system 1 may be divided into a plurality of regions. The respective regions may be consecutive areas in the logical address space, and may include a predetermined number of logical addresses. Each logical-physical address translation table 220 may correlate each of a predetermined number of logical addresses included in one region with each physical address. The root table 210 may indicate the location at which the corresponding logical-physical address translation table 220 is stored for each region.

According to the example of FIG. 3, the logical address space may be divided into $2^a$ regions (for example, $2^8$ regions if a=8), and each region may be identified by a-bits of the higher-order side of a logical address. Here, "a" is a positive integer. The root table 210 may correlate a-bits of the higher-order side of the logical address with a physical address indicating the location of the logical-physical address translation table 220. As an exemplary data structure for this, the root table 210 includes $2^a$ records. In each record, a physical address indicating the location at which the corresponding logical-physical address translation table 220 is stored is recorded. In the root table 210, the respective records may be arranged in the order of logical addresses.

In addition, according to the example of FIG. 3, each region may includes "$2^b$" consecutive logical addresses. Here, "b" is a positive integer. Each logical-physical address translation table 220 may correlate each of the consecutive "$2^b$" logical addresses in the corresponding region with each physical address. As an exemplary data structure for this, each logical-physical address translation table 220 includes "$2^b$" records. In each record, a physical address indicating the location at which the corresponding user data 100 (e.g., 100a or 100b) is stored is recorded. In each logical-physical address translation table 220, the respective records may be arranged in the order of logical addresses.

By searching for the root table 210 using a-bits of the higher-order side of the logical address, which is a translation target, as a search key, the location at which the corresponding logical-physical address translation table 220 is stored can be specified. Then, by searching for the logical-physical address translation table 220, which is stored at the specified location, using b-bits of the lower-order side of the logical address, which is a translation target, as a search key, the physical address corresponding to the logical address as a translation target can be acquired.

Metadata 221 may be attached to each logical-physical address translation table 220. For example, metadata 221a, 221b, 221c, and 221d are attached to the logical-physical address translation tables 220a, 220b, 220c, and 220d, respectively.

Figure 4:
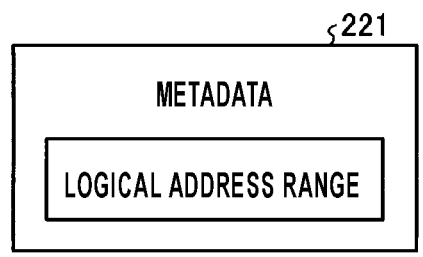
FIG. 4 is a diagram illustrating a configuration of metadata according to the first embodiment.

In the first embodiment, as illustrated in FIG. 4, a logical address range may be recorded in the metadata 221. The logical address range may be a range of logical addresses covered by corresponding logical-physical address translation table 220. The logical address range is represented by, for example, a logical address indicating a region (i.e., a-bits of the higher-order side of the logical address). In the first embodiment, for example, the size of the logical address range (i.e., the size of the region) covered by each logical-physical address translation table 220 is constant. Therefore, the logical address range may be represented only by a head logical address. The logical address range may be represented by a head logical address and a tail logical address of the logical address range covered by the logical-physical address translation table 220. The logical address range may be represented by a head logical address of the logical address range covered by the logical-physical address translation table 220 and size information.

When the logical-physical address translation table 220 is stored in the NAND memory 10, the logical-physical address translation table 220 may be encoded by an error correction circuit, for example, an error correction code (ECC) circuit 29 (see FIG. 1) for error correction. For example, the ECC circuit 29 generates an error correction code 231 from a plurality of logical-physical address translation tables 220, and generates one ECC frame 230 that includes the plurality of logical-physical address translation tables 220 and the error correction code 231. The generated ECC frame 230 may be stored in consecutive areas in the NAND memory 10.

According to the example of FIG. 3, an ECC frame 230a may include four logical-physical address translation tables 220a to 220d, and include an error correction code 231a generated by encoding the four logical-physical address translation tables 220a to 220d. In addition, an ECC frame 230b may include a plurality of logical-physical address translation tables 220 (not illustrated) and an error correction code 231b. The number of logical-physical address translation tables 220 included in one ECC frame 230 may be or may not be fixed.

In reading the logical-physical address translation table 220 from the NAND memory 10, one ECC frame 230, which includes at least the logical-physical address translation table 220, may be read and, detection and correction of an error included in the ECC frame 230 may be executed.

As illustrated in FIG. 1, the memory controller 20 may execute various controls including transmission of user data 100 between the host 2 and the NAND memory 10 or management of the logical-physical address translation information 200. The memory controller 20 may include a central processing unit (CPU) 21, a host interface (I/F) 22, a read controller 23, a write controller 24, a read memory 25, a write memory 26, a cache memory 27, a tag memory 28, and/or an ECC circuit 29.

The memory controller 20 may be configured as, for example, a system-on-a-chip (SoC). The memory controller 20 may be implemented by a plurality of chips. Instead of the CPU 21, the memory controller 20 may include a field-programmable gate array (FPGA) or an application specific integrated circuit (ASIC). That is, the functions of the memory controller 20 can be realized by software, hardware, or a combination thereof.

The read memory 25, the write memory 26, the cache memory 27, and the tag memory 28 may be configured with memories of a type that allows a high-speed operation. The read memory 25, the write memory 26, the cache memory 27, and the tag memory 28 may be configured with a static random access memory (SRAM), a dynamic random access memory (DRAM), a flip-flop, or combinations thereof. Some or all of the read memory 25, the write memory 26, the cache memory 27, and the tag memory 28 may be integrated into one memory. In addition, some or all of the read memory 25, the write memory 26, the cache memory 27, and the tag memory 28 may be provided outside the memory controller 20.

The write memory 26 may be a buffer memory that is used for data transmission from the host 2 to the NAND memory 10. The read memory 25 may be a buffer memory that is used for data transmission from the NAND memory 10 to the host 2.

The host I/F 22 may be an interface circuit for performing communication with the host 2. The host I/F 22 may receive an access request or user data 100 to be written from the host 2, or transmit a response or user data 100 read by a read request to the host 2.

The write controller 24 may be a circuit that controls writing to the NAND memory 10. When the host I/F 22 receives user data 100 from the host 2, the write controller 24 may temporarily store the user data 100 in the write memory 26. Then, when a predetermined condition is satisfied, the write controller 24 may store the user data 100, stored in the write memory 26, into the NAND memory 10.

In addition, when writing the user data 100 to the NAND memory 10, the write controller 24 may store the correspondence between a logical address (i.e., a logical address sent in a write request) designating the location of the user data 100 and a physical address of a write destination of the user data 100 in the write memory 26 or the like, for example. Then, when a predetermined condition is satisfied, the write controller 24 may generate a plurality of logical-physical address translation tables 220 (see FIG. 2) using the stored correspondence. The write controller 24 may add metadata 221 to each of the plurality of logical-physical address translation tables 220. The write controller 24 may write the plurality of logical-physical address translation tables 220, to which the metadata 221 is added, as one ECC frame 230 into the NAND memory 10 via the ECC circuit 29. The write controller 24 may update the root table 210 based on writing of the logical-physical address translation tables 220 into the NAND memory 10.

The ECC circuit 29 may perform encoding for error correction on data stored in the NAND memory 10, and generate an ECC frame. In particular, the ECC circuit 29 may encode a plurality of logical-physical address translation tables 220, to each of which metadata 221 generated by the write controller 24 is added, to generate one ECC frame 230.

In addition, the ECC circuit 29 may decode data, read from the NAND memory 10, on an ECC frame basis, and execute detection and correct of an error. For example, the ECC circuit 29 may execute the detection and correction of an error on the ECC frame 230 read from the NAND memory 10 based on the error correction code 231 included in the ECC frame 230.

An encoding/decoding method executed by the ECC circuit 29 is not limited to a specific method. The ECC circuit 29 may perform encoding/decoding based on a low density parity check (LDPC), for example.

The read controller 23 may be a circuit that controls reading from the NAND memory 10. Upon receiving a read request from the host I/F 22, the read controller 23 may translate a logical address, which is involved in and sent by the read request, into a physical address based on the logical-physical address translation information 200. Then, the read controller 23 may read the user data 100 at least on an ECC frame basis from a location in the NAND memory 10, which is indicated by the physical address obtained by the translation. The ECC circuit 29 may execute the detection and correction of an error on an ECC frame basis on the read user data 100. The read controller 23 may store the user data 100, the error of which is corrected, into the read memory 25. Thereafter, the read controller 23 may transmit the user data 100 in the read memory 25 to the host 2 via the host I/F 22.

Here, the read controller 23 may cache one or more logical-physical address translation tables 220 in the cache memory 27, and when translating, use the logical-physical address translation table 220 cached in the cache memory 27. When the logical-physical address translation table 220 necessary for the translation of a logical address as a translation target (hereinafter, referred to as a "target logical-physical address translation table 220") is not cached in the cache memory 27, the read controller 23 reads the target logical-physical address translation table 220 from the NAND memory 10, and stores the read target logical-physical address translation table 220 in the cache memory 27.

Here, the logical-physical address translation table 220 may be read at least on an ECC frame 230 basis for ECC decoding. In the first embodiment, the read controller 23 may not only cache the target logical-physical address translation table 220 in the cache memory 27, but also may cache another logical-physical address translation table 220, which is included in the same ECC frame 230 as the target logical-physical address translation table 220, in the cache memory 27.

The cache memory 27 may cache one or more logical-physical address translation tables 220. The tag memory 28 may record tag information. When the tag information of a desired logical-physical address translation table 220 is present in the tag memory 28, the logical-physical address translation table 220 is regarded as being cached in the cache memory 27. When the tag information of the desired logical-physical address translation table 220 is not present in the tag memory 28, the desired logical-physical address translation table 220 is regarded as not being cached in the cache memory 27.

In addition, an associative method applied to the cache memory 27 and the tag memory 28 is not limited to a specific method. For example, a full-associative method, a direct-map method, or an n-way set-associative method or a combination thereof may be adopted.

The CPU 21 may be a circuit that comprehensively controls the respective constituent elements provided in the memory controller 20. The CPU 21 may execute control based on a predetermined program.

Figure 5:
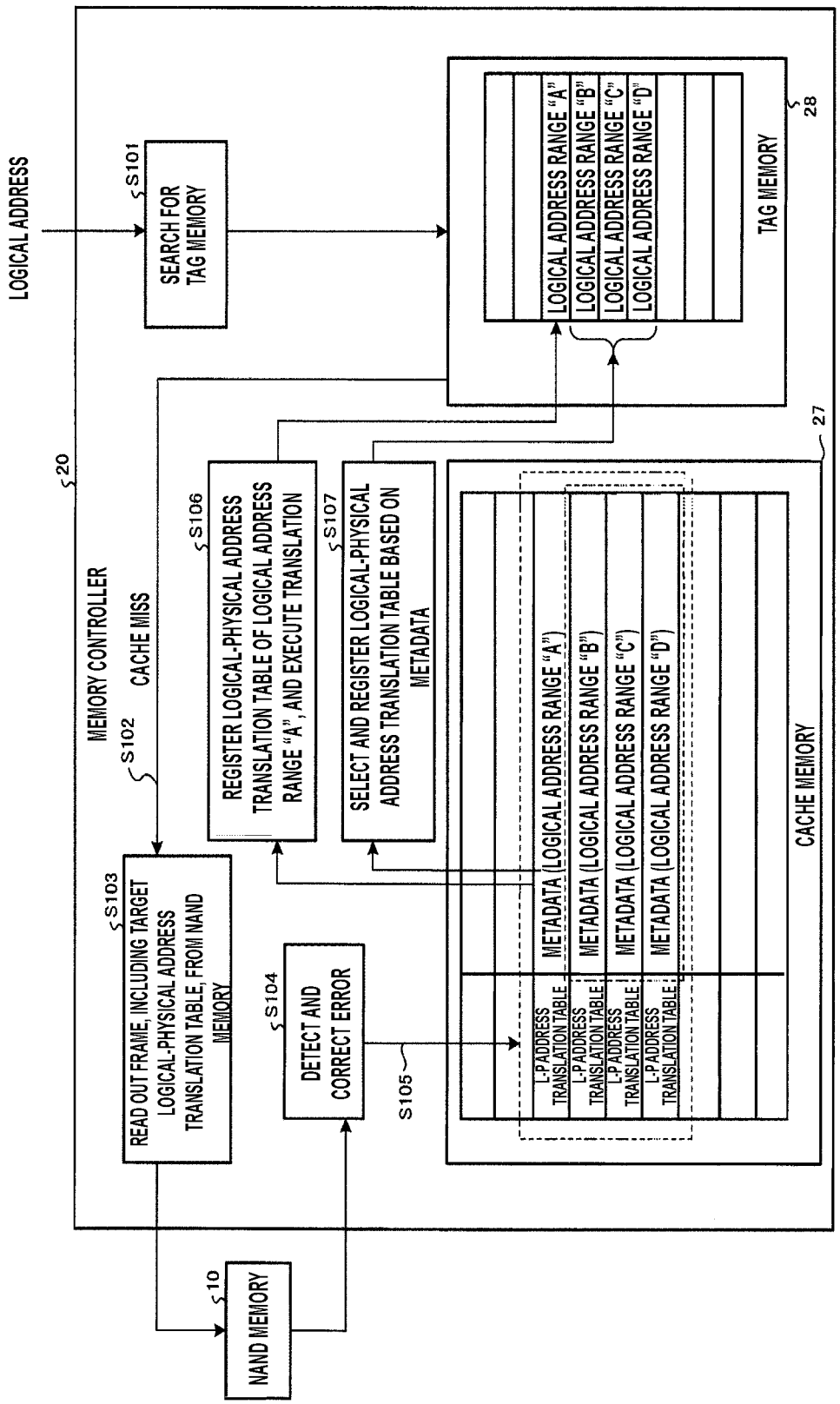
FIG. 5 is a diagram for explaining an overview of an operation of the memory system according to the first embodiment.

FIG. 5 is a diagram for explaining the outline of an operation of the memory system 1 according to the first embodiment. The read controller 23 (see FIG. 1) may search for the tag memory 28, and determine whether or not a target logical-physical address translation table 220 is cached in the cache memory 27 (S101). The tag memory 28 may record (or, register) tag information indicating whether the logical-physical address translation table 220 is cached in the cache memory 27.

In one example, a logical address range indicating a corresponding region may be used as the tag information. In S101, the tag memory 28 may be searched for, by using a logical address which is a translation target, as a search key. When any one piece of tag information recorded in the tag memory 28 includes the logical address as the translation target, it may be determined to be a cache hit. When any one piece of tag information recorded in the tag memory 28 includes no logical address as the translation target, it may be determined to be a cache miss.

When a cache hit occurs, the read controller 23 (see FIG. 1) may execute translation using the logical-physical address translation table 220 in the logical address range including the logical address as the translation target, which is cached in the cache memory 27.

When a cache miss occurs (S102), that is, when it is determined that the target logical-physical address translation table 220 is not cached in the cache memory 27, the read controller 23 may read an ECC frame 230 including the target logical-physical address translation table 220 from the NAND memory 10 (S103). The ECC frame 230 read from the NAND memory 10 may be decoded by the ECC circuit 29, and detection and correction of an error may be executed (S104).

Thereafter, the read controller 23 may store all of the logical-physical address translation tables 220 included in the ECC frame 230 into the cache memory 27, together with the metadata 221 (S105). In addition, here, it is assumed that the ECC frame 230 includes four logical-physical address translation tables 220 corresponding to logical address ranges "A", "B", "C", and "D", and that the target logical-physical address translation table 220 is the logical-physical address translation table 220 related to the logical address range "A".

The read controller 23 may register the target logical-physical address translation table 220 as cache data, and execute translation using the target logical-physical address translation table 220 stored in the cache memory 27 (S106). The target logical-physical address translation table 220 may be registered as cache data by recording the tag information thereof into the tag memory 28. That is, the logical address range "A" recorded in the metadata 221 may be recorded into the tag memory 28.

In addition, the read controller 23 may select a logical-physical address translation table 220, which satisfies a predetermined condition, from the other logical-physical address translation tables 220 excluding the target logical-physical address translation table 220, based on the metadata 221 of each logical-physical address translation table 220 stored in the cache memory 27 by the processing of S105, and may register the selected logical-physical address translation table 220 as cache data (S107). In this figure, as an example, all of the other logical-physical address translation tables 220 (e.g., the logical-physical address translation tables 220 related to the logical address ranges "B", "C", and "D") included in the same ECC frame 230 are selected and registered.

In this manner, the read controller 23 can cache not only the target logical-physical address translation table 220 but also another logical-physical address translation table 220, which is included in the same ECC frame 230 as the target logical-physical address translation table 220, into the cache memory 27. Therefore, when said another logical-physical address translation table 220 is required later, a cache hit can occur. Since the cache hit rate of the logical-physical address translation information 200 is improved, the performance of processing the read request can be improved.

In addition, a method of selecting the logical-physical address translation table 220 is not limited to a specific method. For example, a valid logical-physical address translation table 220 is selected, and an invalid logical-physical address translation table 220 is not selected. The valid logical-physical address translation table 220 may refer to the latest logical-physical address translation table 220 among one or more logical-physical address translation tables 220 related to the same region. In a case where a plurality of logical-physical address translation tables 220 related to the same region are present in the NAND memory 10, the invalid logical-physical address translation table 220 may be a logical-physical address translation table 220, excluding the latest logical-physical address translation table 220, among the plurality of logical-physical address translation tables 220.

Whether any logical-physical address translation table 220 is valid or invalid may be determined based on whether or not the location at which the logical-physical address translation table 220 is stored is correlated with any one logical address by the root table 210. For example, the logical address range recorded in the metadata 221 of the logical-physical address translation table 220 is translated into a physical address by using the root table 210, and when such a translated physical address indicates the location at which the corresponding logical-physical address translation table 220 is stored, the logical-physical address translation table 220 may be determined to be a valid logical-physical address translation table 220. When the translated physical address does not indicate the location at which the logical-physical address translation table 220 is stored, the logical-physical address translation table 220 may be determined to be an invalid logical-physical address translation table 220.

In addition, a method of determining whether the logical-physical address translation table 220 is valid or invalid is not limited to the above method. It may be determined whether the logical-physical address translation table 220 is valid or invalid based on the metadata 221.

Figure 6A:
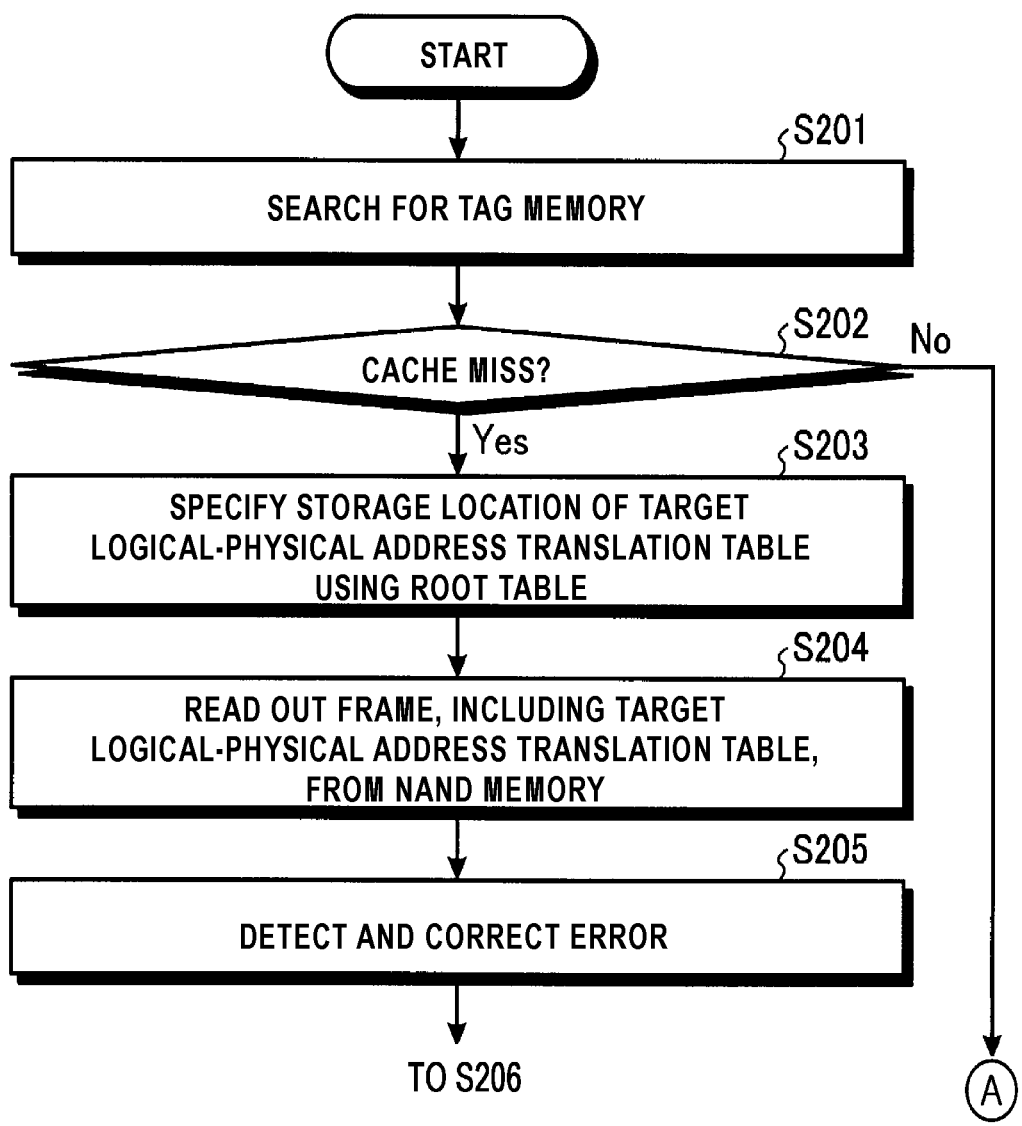
FIGS. 6A and 6B are flowcharts illustrating a cache operation of the memory system according to the first embodiment.
Figure 6B:
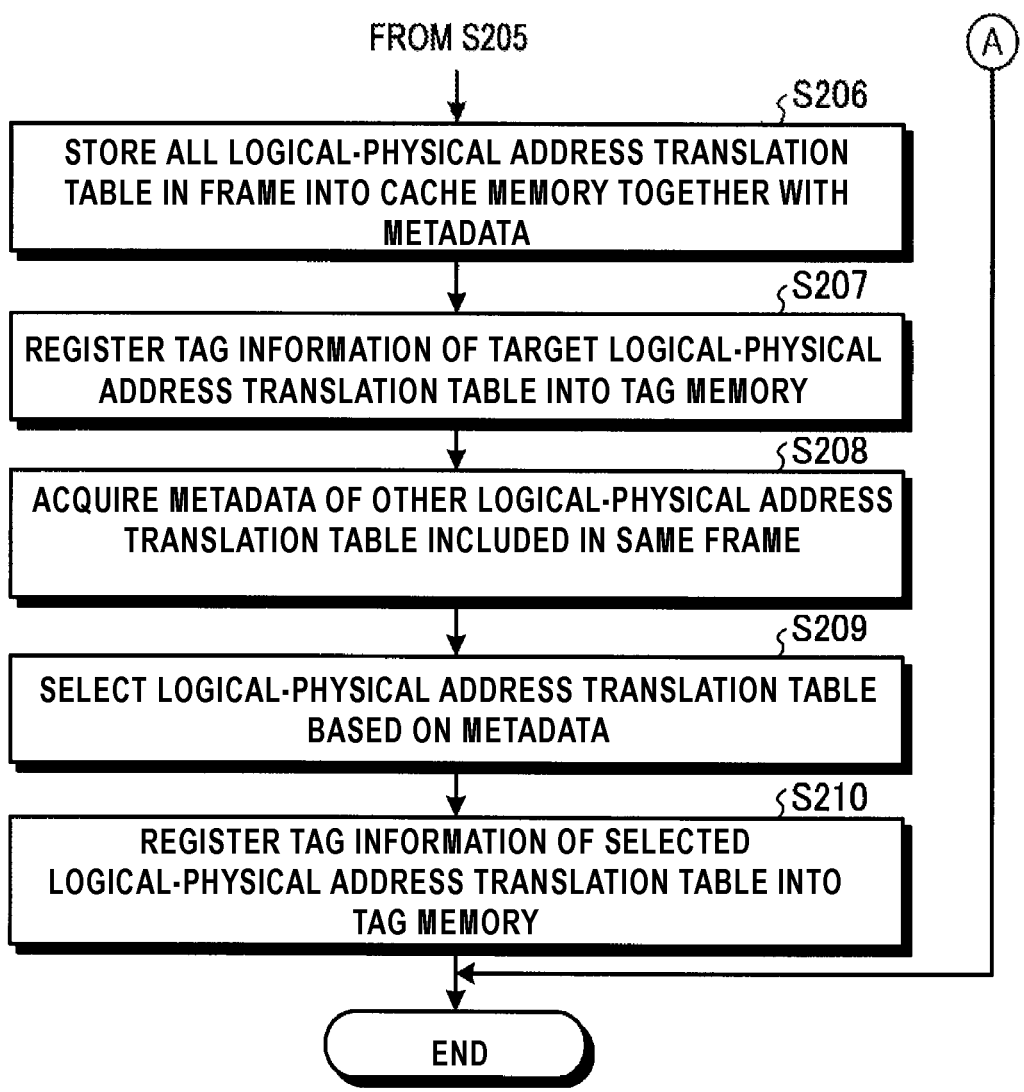

FIG. 6A and FIG. 6B are flowcharts illustrating a cache operation of the memory system 1 according to the first embodiment. The operation illustrated in this figure may be executed when to use a target logical-physical address translation table 220.

The read controller 23 (see FIG. 1) may first search for the tag memory 28 to determine whether or not the target logical-physical address translation table 220 is cached in the cache memory 27 (S201). For example, the read controller 23 searches for the tag memory 28 using a logical address, which is a translation target, as a search key.

When a cache miss occurs as a result of searching for the tag memory 28 (S202, Yes), the read controller 23 may specify a storage location of the target logical-physical address translation table 220 based on the root table 210 (S203).

In S203, the read controller 23 may refer to the root table 210 stored in the NAND memory 10, for example. In some embodiments, the read controller 23 may load the root table 210 in advance in a memory (e.g., the read memory 25) that allows a high-speed operation, and may refer to the loaded root table 210.

Subsequently, the read controller 23 may read an ECC frame 230, which includes the target logical-physical address translation table 220, from the specified location in the NAND memory 10 (S204). At that time, the ECC circuit 29 may execute detection and correction of an error (S205). After correcting the error, the read controller 23 may store all of the logical-physical address translation tables 220 included in the read ECC frame 230, into the cache memory 27, together with the metadata 221 (S206).

In addition, a method of selecting a cache line in which the logical-physical address translation table 220 is stored is not limited to a specific method. For example, a cache line may be selected by a least recently used (LRU), or may be selected by a round robin method. A cache line may also be randomly selected.

Subsequently, the read controller 23 may register tag information indicating the target logical-physical address translation table 220 into the tag memory 28 (S207). Thereby, the target logical-physical address translation table 220 may be cached in the cache memory 27.

Subsequently, the read controller 23 may acquire the metadata 221 of the other logical-physical address translation tables 220, included in the same ECC frame 230 as the target logical-physical address translation table 220, from the cache memory 27 (S208). Then, the read controller 23 may select a logical-physical address translation table 220 from among the other logical-physical address translation tables 220 included in the same ECC frame 230 as the target logical-physical address translation table 220 based on each metadata 221 (S209). Then, the read controller 23 may register tag information indicating the selected logical-physical address translation table 220 into the tag memory 28 (S210). Thereby, the selected logical-physical address translation table 220 may be cached in the cache memory 27.

When a cache hit occurs (S202, No), or by the processing of S210, the cache operation may be completed. The read controller 23 may execute translation by using the target logical-physical address translation table 220 cached in the cache memory 27.

In addition, in the processing of S206, the read controller 23 may store all of the logical-physical address translation tables 220 included in the read ECC frame 230 into the cache memory 27. The read controller 23 may store all of the logical-physical address translation tables 220 included in the read ECC frame 230, together with the metadata 221, into a memory (e.g., the read memory 25) different from the cache memory 27, and thereafter, may cache the target logical-physical address translation table 220 and a logical-physical address translation table 220, selected based on the metadata 221, into the cache memory 27. In addition, the read controller 23 may not necessarily have to leave the metadata 221 in the cache memory 27.

Here, the processing steps illustrated in FIG. 6A and FIG. 6B are explained to be executed by the read controller 23 or the ECC circuit 29. In some embodiments, some or all of the processing steps illustrated in FIG. 6A and FIG. 6B may be executed by other constituent elements (e.g., the CPU 21) provided in the memory controller 20.

The logical-physical address translation table 220 may also be used in a processing other than the processing of a read request. For example, the memory controller 20 may refer to the logical-physical address translation table 220 when executing relocation of user data 100. The relocation includes, for example, garbage collection or refresh. The memory controller 20 may refer to the logical-physical address translation table 220 when updating a correspondence relationship between a logical address and a physical address, involved in a write request from the host 2. The memory controller 20 may refer to the logical-physical address translation table 220 during an Unmap processing (also referred to as a "Trim processing"). The memory controller 20 may execute a series of processing steps illustrated in FIG. 6A and FIG. 6B when using (or referring to) the logical-physical address translation table 220 for other processing than a read request.

As described above, according to the first embodiment, the memory controller 20 may divide and manage the correspondence between logical addresses belonging to a logical address space and physical addresses into a plurality of logical-physical address translation tables 220. Then, the memory controller 20 may attach metadata 221 to each logical-physical address translation table 220, and store each logical-physical address translation table 220 with the metadata 221 attached into the NAND memory 10. Then, the memory controller 20 may read the ECC frame 230 including a target logical-physical address translation table 220 from the NAND memory 10, and select a logical-physical address translation table 220, excluding the target logical-physical address translation table 220, from among the plurality of logical-physical address translation tables 220 included in the ECC frame 230 based on the metadata 221, and cache the target logical-physical address translation table 220 and the selected logical-physical address translation table 220 into the cache memory 27.

With this configuration, the memory controller 20 may store not only the target logical-physical address translation table 220 but also another logical-physical address translation table 220, which is read at the same timing as the target logical-physical address translation table 220, into the cache memory 27. Thus, it is possible to efficiently fill the cache line of the cache memory 27. As a result, the cache hit rate can be improved and the performance of the memory system 1 can be improved.

In addition, the unit of reading the logical-physical address translation table 220 from the NAND memory 10 is not limited only to the ECC frame 230. For example, the read controller 23 may collectively read all of the logical-physical address translation tables 220 from consecutive areas (e.g., one page) including a storage location of the target logical-physical address translation table 220. Then, the read controller 23 may select the logical-physical address translation table 220 to be cached in the cache memory 27 based on the metadata 221 from among the collectively read logical-physical address translation tables 220.

In addition, according to the first embodiment, the memory controller 20 may register a logical address range that the logical-physical address translation table 220 covers, which is included in the metadata 221, as tag information. Thus, it is possible to determine a cache hit or a cache miss by searching for the tag memory 28 using a logical address, which is a translation target, as a search key.

Second Embodiment

The logical-physical address translation information 200 may have a hierarchical structure.

FIG. 7 is a diagram for explaining a data structure of the logical-physical address translation information 200 according to the second embodiment. The logical-physical address translation information 200 may include, as the logical-physical address translation table 220 having a plurality of hierarchies: a logical-physical address translation table 220 of a first hierarchy, a logical-physical address translation table 220 of a second hierarchy, and a logical-physical address translation table 220 of a third hierarchy from the root table 210 side (in other words, from a higher-order side). In this figure, as an example, logical-physical address translation tables 220e and 220f are drawn as the logical-physical address translation table 220 of the first hierarchy, logical-physical address translation tables 220g and 220h are drawn as the logical-physical address translation table 220 of the second hierarchy, and logical-physical address translation tables 220i, 220j and 220k are drawn as the logical-physical address translation table 220 of the third hierarchy. The number of logical-physical address translation tables 220 of each hierarchy constituting the logical-physical address translation information 200 is not limited thereto.

A physical address, which indicates the location at which a logical-physical address translation table 220 belonging to the first hierarchy is stored, may be recorded in each record of the root table 210. A physical address, which indicates the location at which a logical-physical address translation table 220 belonging to the second hierarchy level is stored, may be recorded in each record of the respective logical-physical address translation tables 220 belonging to the first hierarchy. A physical address, which indicates the location at which a logical-physical address translation table 220 belonging to the third hierarchy is stored, may be recorded in each record of the respective logical-physical address translation tables 220 belonging to the second hierarchy. A physical address, which indicates the location at which user data 100 is stored, may be recorded in each record of each logical-physical address translation table 220 belonging to the third hierarchy.

The read controller 23 may divide a logical address into four bit-strings, and refer to the root table 210 and the logical-physical address translation tables 220 belonging to each hierarchy by using the bit-strings. For example, the highest order side bit-string of the logical address may be used to refer to the root table 210. The second bit-string from the highest order side of the logical address may be used to refer to the logical-physical address translation table 220 belonging to the first hierarchy specified by referring to the root table 210. The third bit-string from the highest order side of the logical address may be used to refer to the logical-physical address translation table 220 belonging to the second hierarchy specified by referring to the logical-physical address translation table 220 belonging to the first hierarchy. The lowest order side bit-string of the logical address may be used to refer to the logical-physical address translation table 220 belonging to the third hierarchy specified by referring to the logical-physical address translation table 220 belonging to the second hierarchy.

In this way, the logical address may be translated into a physical address indicating a storage location of the user data 100 with the root table 210 and the logical-physical address translation tables 220 of a plurality of hierarchies.

Similarly to the first embodiment, an ECC frame 230 that includes a plurality of logical-physical address translation tables 220 may be encoded and stored in the NAND memory 10. One ECC frame 230 may include the logical-physical address translation tables 220 of any hierarchy. The metadata 221 may be added to each respective logical-physical address translation table 220 by the write controller 24.

Figure 8:
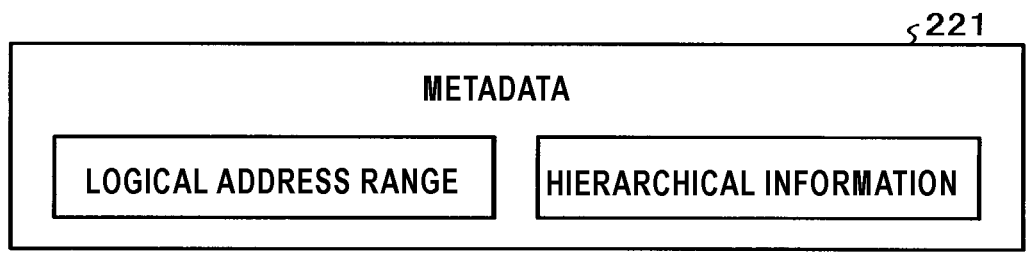
FIG. 8 is a diagram illustrating a data structure of metadata according to the second embodiment.

FIG. 8 is a diagram illustrating a data structure of the metadata 221 according to the second embodiment. As illustrated in this figure, in the second embodiment, the metadata 221 may include hierarchical information in addition to the logical address range. The hierarchical information may be information indicating the hierarchy, to which the logical-physical address translation table 220 belongs. For example, a number "i" may be recorded as the hierarchical information of the logical-physical address translation table 220 belonging to an i-th hierarchy. Note that a number "i–1" may also be recorded as the hierarchical information of the logical-physical address translation table 220 belonging to an i-th hierarchy.

Each logical-physical address translation table 220 may be cached in the cache memory 27 (see FIG. 1), irrespective of the hierarchy to which it belongs. In the tag memory 28

(see FIG. 1), for example, a pair of a logical address range and hierarchical information may be registered as tag information.

FIG. 9A and FIG. 9B are flowcharts illustrating a cache operation of the memory system 1 according to the second embodiment.

The read controller 23 (see FIG. 1) may first searches for the tag memory 28 (see FIG. 1) to determine whether or not a target logical-physical address translation table 220 is cached in the cache memory 27 (S301). The read controller 23 may use a logical address, which is a translation target, as a search key.

When a cache miss occurs as a result of searching for the tag memory 28 (S302, Yes), the read controller 23 may specify a storage location of the target logical-physical address translation table 220 (S303).

In S303, for example, the read controller 23 may acquire and refer to a table that is higher by only one hierarchy (e.g., the root table 210 or the logical-physical address translation table 220).

Subsequently, the read controller 23 may read an ECC frame 230, including the target logical-physical address translation table 220, from the specified location in the NAND memory 10 (S304). At that time, the ECC circuit 29 may execute detection and correction of an error (S305). After correcting the error, the read controller 23 may store all of the logical-physical address translation tables 220, included in the read ECC frame 230, into the cache memory 27, together with the metadata 221 (S306).

Subsequently, the read controller 23 may register tag information indicating the target logical-physical address translation table 220 into the tag memory 28 (S307). Thereby, the target logical-physical address translation table 220 may be cached in the cache memory 27.

Subsequently, the read controller 23 may acquire the metadata 221 of the other logical-physical address translation tables 220, included in the same ECC frame 230 as the target logical-physical address translation table 220, from the cache memory 27 (S308). Then, the read controller 23 may select a logical-physical address translation table 220, which belongs to a hierarchy higher than a predetermined hierarchy, from among the other logical-physical address translation tables 220 included in the same ECC frame 230 as the target logical-physical address translation table 220 based on the metadata 221 (S309). Then, the read controller 23 may register tag information indicating the selected logical-physical address translation table 220 into the tag memory 28 (S310). Thereby, the selected logical-physical address translation table 220 may be cached in the cache memory 27.

When a cache hit occurs (S302, No), or by the processing of S310, a cache operation related to the target logical-physical address translation table 220 may be completed. The read controller 23 may execute translation by using the target logical-physical address translation table 220 cached in the cache memory 27.

As described above, according to the second embodiment, the logical-physical address translation information 200 may have a hierarchical structure. The metadata 221 attached to each logical-physical address translation table 220 may include hierarchical information indicating a hierarchy to which the logical-physical address translation table 220 belongs. The memory controller 20 may select a logical-physical address translation table 220, which belongs to a hierarchy higher than a predetermined hierarchy, based on the hierarchical information, and may cache the target logical-physical address translation table 220 and the selected logical-physical address translation table 220 into the cache memory 27.

A logical address range covered by a logical-physical address translation table 220 of the higher-order side may be wider than a logical address range covered by a logical-physical address translation table 220 of the lower-order side. According to the above method, the cache hit rate can be improved since the logical-physical address translation table 220 of the higher-order side may be preferentially cached in the cache memory 27.

In addition, a method of selecting a logical-physical address translation table 220 based on the hierarchical structure is not limited to this. For example, the logical-physical address translation table 220, which belongs to a hierarchy lower than a predetermined hierarchy, may be selected and cached into the cache memory 27. In a process of translating a logical address to a physical address, a logical-physical address translation table 220 of the lower-order side may require a smaller amount of processing to obtain a physical address than a logical-physical address translation table 220 of the higher-order side. Thus, when the logical-physical address translation table 220 of the lower-order side is preferentially cached in the cache memory 27, the time required for translation may be shortened when a cache hit occurs.

Third Embodiment

According to the first embodiment and the second embodiment, a logical-physical address translation table 220 may be cached in the cache memory 27 in the memory system 1. In some embodiments, the logical-physical address translation table 220 may be cached in the host 2.

Figure 10:
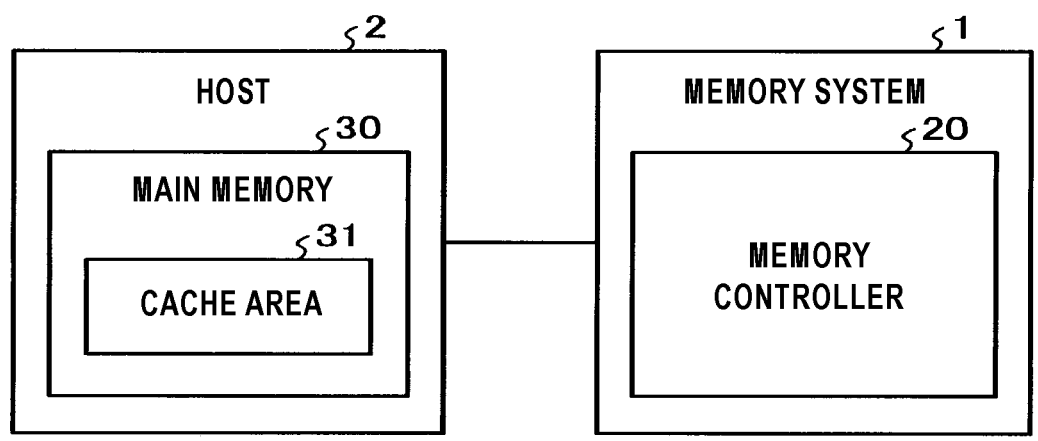
FIG. 10 is a diagram for explaining a location at which a logical-physical address translation table according to a third embodiment is cached.

For example, as illustrated in FIG. 10, the host 2 may include a main memory 30. In the main memory 30, a cache area 31 that the memory system 1 can use may be allocated. The memory system 1 caches the logical-physical address translation table 220 in the cache area 31.

To cache the logical-physical address translation table 220 into the cache area 31, the memory controller 20 may transmit a write request for writing the logical-physical address translation table 220 into the cache area 31 to the host 2. When referring to the logical-physical address translation table 220 cached in the cache area 31, the memory controller 20 may transmit a read request for reading the logical-physical address translation table 220 to the host 2.

In this manner, the memory in which the logical-physical address translation table 220 is cached may be provided in the host 2.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A memory system connectable to a host, comprising:
a first memory that is nonvolatile; and
a memory controller configured to:
divide first logical-physical address translation information, which correlates a logical address with a physical address of the first memory, into a plurality of pieces of second logical-physical address translation information;

attach metadata to each of the plurality of pieces of second logical-physical address translation information and store each of the plurality of pieces of second logical-physical address translation information with the attached metadata, into the first memory;

when using third logical-physical address translation information, which is one of the plurality of pieces of second logical-physical address translation information, read, as a plurality of pieces of fourth logical-physical address translation information, pieces of second logical-physical address translation information including the third logical-physical address translation information, from among the plurality of pieces of second logical-physical address translation information stored in the first memory;

select fifth logical-physical address translation information, which is different from the third logical-physical address translation information, from among the read plurality of pieces of fourth logical-physical address translation information based on the metadata attached to each of the plurality of pieces of fourth logical-physical address translation information; and cache the selected fifth logical-physical address translation information into a second memory.

2. The memory system according to claim 1, wherein the metadata attached to each of the plurality of pieces of second logical-physical address translation information includes a logical address range covered by corresponding second logical-physical address translation information, and
wherein the memory controller is further configured to register a logical address range included in the metadata, which is added to the fifth logical-physical address translation information, as tag information.

3. The memory system according to claim 1, wherein the plurality of pieces of fourth logical-physical address translation information is stored in consecutive areas of the first memory.

4. The memory system according to claim 1, further comprising an error correction circuit,
wherein the plurality of pieces of fourth logical-physical address translation information are included in one frame for error correction by the error correction circuit.

5. The memory system according to claim 1, wherein the first logical-physical address translation information has a hierarchical structure,
wherein the metadata attached to each of the plurality of pieces of second logical-physical address translation information includes hierarchical information indicating a hierarchy, to which the second logical-physical address translation information belongs, and
wherein the memory controller is configured to select the fifth logical-physical address translation information based on the hierarchical information included in the metadata added to each of the plurality of pieces of fourth logical-physical address translation information.

6. The memory system according to claim 1, wherein the second memory is provided in the host.

7. A memory system connectable to a host, comprising:
a first memory that is nonvolatile; and
a memory controller configured to:
divide first logical-physical address translation information, which correlates a logical address with a physical address of the first memory, into a plurality of pieces of second logical-physical address translation information;

attach metadata to each of the plurality of pieces of second logical-physical address translation information and store each of the plurality of pieces of second logical-physical address translation information with the attached metadata, into the first memory;

when using third logical-physical address translation information, which is one of the plurality of pieces of second logical-physical address translation information, read, as a plurality of pieces of fourth logical-physical address translation information, pieces of second logical-physical address translation information including the third logical-physical address translation information, from among the plurality of pieces of second logical-physical address translation information stored in the first memory; and cache the third logical-physical address translation information into a second memory,
wherein the metadata attached to each of the plurality of pieces of second logical-physical address translation information includes a logical address range covered by the corresponding second logical-physical address translation information, and
wherein the memory controller is configured to register a logical address range included in the metadata, which is added to the third logical-physical address translation information, as tag information.

8. The memory system according to claim 7, further comprising an error correction circuit,
wherein the plurality of pieces of fourth logical-physical address translation information are included in one error correction code (ECC) frame for error correction by the error correction circuit.

9. The memory system according to claim 7, wherein the second memory is provided in the host.

10. The memory system according to claim 7, wherein the plurality of pieces of fourth logical-physical address translation information is stored in consecutive areas of the first memory.

11. The memory system according to claim 7, wherein the memory controller is further configured to:
select fifth logical-physical address translation information, which is different from the third logical-physical address translation information, from among the plurality of pieces of fourth logical-physical address translation information based on the metadata attached to each of the plurality of pieces of fourth logical-physical address translation information; and
cache the fifth logical-physical address translation information into the second memory.

12. The memory system according to claim 11, wherein the memory controller is configured to register a logical address range included in the metadata, which is added to the fifth logical-physical address translation information, as tag information.

13. The memory system according to claim 11, wherein the first logical-physical address translation information has a hierarchical structure,
wherein the metadata attached to each of the plurality of pieces of second logical-physical address translation information includes hierarchical information indicating a hierarchy, to which the second logical-physical address translation information belongs, and
wherein the memory controller is configured to select the fifth logical-physical address translation information based on the hierarchical information included in the metadata added to each of the plurality of pieces of fourth logical-physical address translation information.

14. A method of controlling a memory system connectable to a host and including a memory controller and a first memory that is nonvolatile, the method comprising:

dividing, by the memory controller, first logical-physical address translation information, which correlates a logical address with a physical address of the first memory, into a plurality of pieces of second logical-physical address translation information;

attaching, by the memory controller, metadata to each of the plurality of pieces of second logical-physical address translation information and storing, by the memory controller, each of the plurality of pieces of second logical-physical address translation information with the attached metadata, into the first memory;

when using, by the memory controller, third logical-physical address translation information, which is one of the plurality of pieces of second logical-physical address translation information, reading by the memory controller, as a plurality of pieces of fourth logical-physical address translation information, pieces of second logical-physical address translation information including the third logical-physical address translation information, from among the plurality of pieces of second logical-physical address translation information stored in the first memory;

caching, by the memory controller, the third logical-physical address translation information into a second memory; and registering, by the memory controller, a logical address range included in the metadata, which is added to the third logical-physical address translation information, as tag information, wherein the metadata attached to each of the plurality of pieces of second logical-physical address translation information includes a logical address range covered by the corresponding second logical-physical address translation information.

15. The method according to claim 14,
wherein the memory system further includes an error correction circuit, wherein the plurality of pieces of fourth logical-physical address translation information are included in one error correction code (ECC) frame for error correction by the error correction circuit.

16. The method according to claim 14, wherein the second memory is provided in the host.

17. The method according to claim 14, wherein the plurality of pieces of fourth logical-physical address translation information is stored in consecutive areas of the first memory.

18. The method according to claim 14, further comprising:

selecting, by the memory controller, fifth logical-physical address translation information, which is different from the third logical-physical address translation information, from among the plurality of pieces of fourth logical-physical address translation information based on the metadata attached to each of the plurality of pieces of fourth logical-physical address translation information; and caching, by the memory controller, the fifth logical-physical address translation information into the second memory.

19. The method according to claim 18, further comprising:

registering, by the memory controller, a logical address range included in the metadata, which is added to the fifth logical-physical address translation information, as tag information.

20. The method according to claim 18,
wherein the first logical-physical address translation information has a hierarchical structure, wherein the metadata attached to each of the plurality of pieces of second logical-physical address translation information includes hierarchical information indicating a hierarchy, to which the second logical-physical address translation information belongs, and wherein the method further comprises selecting, by the memory controller, the fifth logical-physical address translation information based on the hierarchical information included in the metadata added to each of the plurality of pieces of fourth logical-physical address translation information.

* * * * *